(12) United States Patent
Simmonds et al.

(10) Patent No.: US 7,884,593 B2
(45) Date of Patent: Feb. 8, 2011

(54) DIFFERENTIAL AND SYMMETRICAL CURRENT SOURCE

(75) Inventors: Michael Simmonds, Bozeman, MT (US); Paul Alesu, San Diego, CA (US)

(73) Assignee: Quantum Design, Inc., San Diego, CA (US)

( * ) Notice: Subject to any disclaimer, the term of this patent is extended or adjusted under 35 U.S.C. 154(b) by 419 days.

(21) Appl. No.: 12/055,997

(22) Filed: Mar. 26, 2008

(65) Prior Publication Data

US 2009/0243723 A1    Oct. 1, 2009

(51) Int. Cl.
G05F 3/04    (2006.01)
(52) U.S. Cl. .................................. 323/312
(58) Field of Classification Search .......... 323/304–317
See application file for complete search history.

(56) References Cited

U.S. PATENT DOCUMENTS

| 4,242,741 | A | * | 12/1980 | Parrish | 367/21 |
| 4,528,495 | A | * | 7/1985 | Dorsman | 323/268 |
| 5,021,729 | A | * | 6/1991 | Sutton | 323/311 |
| 5,731,692 | A | * | 3/1998 | Garcia | 323/274 |
| 6,501,255 | B2 | * | 12/2002 | Pomeroy | 323/312 |
| 2007/0115050 | A1 | * | 5/2007 | Blon | 330/69 |
| 2007/0139385 | A1 | * | 6/2007 | Inokuchi | 345/173 |

* cited by examiner

*Primary Examiner*—Adolf Berhane
*Assistant Examiner*—Jeffrey Gblende
(74) *Attorney, Agent, or Firm*—The MaxHam Firm

(57) ABSTRACT

A controlled, symmetrical, stable current source that can power floating resistive loads, eliminates the need to connect the load directly to either a power supply or ground and protects the load against overpower should either or both sides of the load be shorted to ground. The current source includes two operational amplifiers for providing a current through the load that is proportional to an input voltage applied across the respective non-inverting inputs of the two operational amplifiers; two current sensing resistors for providing voltage drops that are proportional to the current through the load; and four summing resistors connected to the sensing resistors for providing to the inverting inputs of the operational amplifiers voltages that offset the sum of the voltage drops provided by the sensing resistors so that the current through the load is controlled by only the input voltage.

10 Claims, 1 Drawing Sheet

DIFFERENTIAL AND SYMMETRICAL CURRENT SOURCE

BACKGROUND OF THE INVENTION

1. Field of the Invention

The present invention relates to electrical circuits for providing a controlled current through a resistive load, and is particularly directed to current sources that are differential and symmetrical.

2. Discussion of Prior Art

There are known many types of current source circuits. Most of them are unipolar, but several are differential and symmetrical. In order to keep the load potentials symmetrical, the current source circuits typically employ several operational amplifiers in a feedback loop. This approach is both complex and prone to oscillations. Thus, there is a need for a new differential and symmetrical current source that is both simple and robust.

SUMMARY OF THE INVENTION

An objective of the present invention is to provide a controlled current source that is differential, symmetrical and robust and protects a floating resistive load against overpower should either or both sides of the load to be shorted to ground.

To achieve this, and other, objectives, the present invention provides a voltage-controlled current source for providing to a floating resistive load a current that is proportional to an input voltage, while maintaining the load at symmetrical potentials, the current source comprising: first and second operational amplifiers for providing a current through the load that is proportional to an input voltage applied across the respective non-inverting inputs of the first and second operational amplifiers; sensing means connected to the outputs of the first and second operational amplifiers for providing voltage drops that are proportional to the current through the load; and summing means connected to the sensing means for providing to the inverting inputs of the first and second operational amplifiers voltages that offset the sum of the voltage drops provided by the sensing means so that the current through the load is maintained in constant proportion to the input voltage.

The operational amplifiers supply to the load the amount of energy that is needed to offset the input voltage by the sum of the voltages that are provided to the inverting inputs by the summing means, to thereby provide a controlled current to the load that is maintained in constant proportion to the input voltage. The current through the load is controlled by adjusting the input voltage.

Additional features of the present invention are described with reference to the detailed description of the preferred embodiments.

BRIEF DESCRIPTION OF THE DRAWING

The above and other aspects, features, and advantages of the present invention will become more apparent upon consideration of the following description of preferred embodiments, taken in conjunction with the accompanying drawing, wherein.

DETAILED DESCRIPTION

Figure 1:
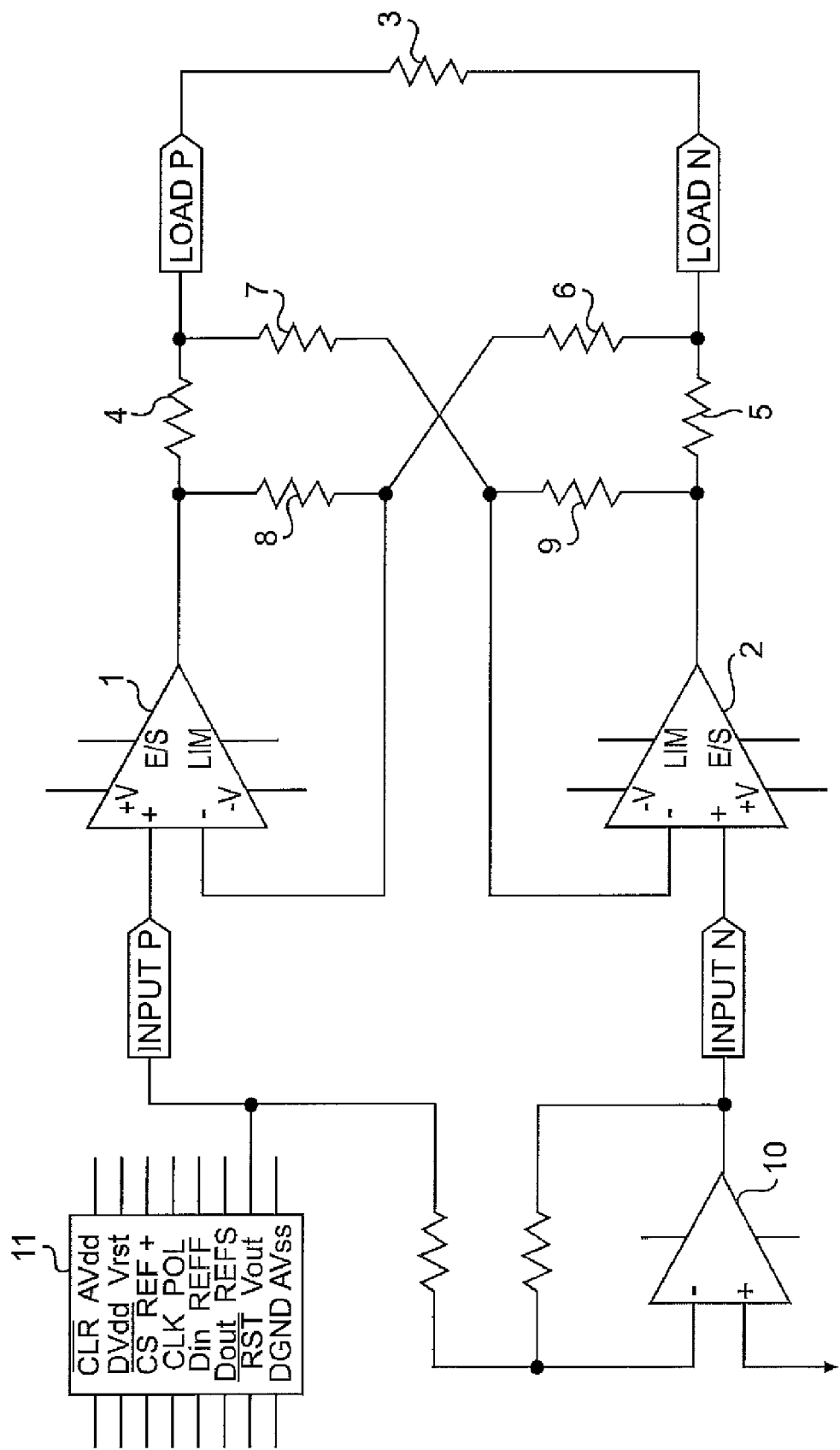
FIG. 1 is a diagram of a preferred embodiment of the symmetrical current source of the present invention.

Referring to the drawing, a preferred embodiment of the symmetrical current source of the present invention includes first power operational amplifier 1 and second power operational amplifier 2 for supplying power to resistive load 3. Between the power operational amplifier and the load are first resistor 4 and second resistor 5 for sensing the current through the load, third resistor 6, fourth resistor 7, fifth resistor 8, and sixth resistor 9, all for providing to the respective inverting inputs of operational amplifiers 1 and 2 feedback voltages that, in combination, are proportional to the sum of the voltage drops across the two current sensing resistors 4 and 5.

The first and second operational amplifiers provide a current through the load that is proportional to an input voltage applied across the respective non-inverting inputs of these first and second operational amplifiers.

First and second resistors 4 and 5 are respectively connected to the outputs of the operational amplifiers for providing voltage drops that are proportional to the current through load 3 when first resistor 4 is connected between the output of operational amplifier 1 and one side of load 3, and second resistor 5 is connected between the output of operational amplifier 2 and the other side of load 3.

Third resistor 6 is connected between the inverting input of the first operational amplifier and one side of second resistor 5. Fourth resistor 7 is connected between the inverting input of the second operational amplifier and one side of first resistor 4. Fifth resistor 8 is connected between the inverting input and the output of the first operational amplifier, the output being connected to the other side of first resistor 4. Sixth resistor 9 is connected between the inverting input and the output of the second operational amplifier, the output being connected to the other side of second resistor 5.

When first and second resistors 4 and 5 are connected to opposite sides of the load 3 and power is being provided to the load by the two operational amplifiers, the third, fourth, fifth and sixth resistors (6, 7, 8 and 9) in combination provide to the inverting inputs of the first and second operational amplifiers voltages that offset the sum of the voltage drops of first and second resistors 4 and 5 so that the current through Toad 3 is maintained in constant proportion to the input voltage.

When one side of the load is shorted to ground, the voltage across the shorted sense resistor 4 or 5 will be higher than the voltage across the other sense resistor 5 or 4, which will still reflect the current through load 3 and thus will reduce the power into the load. When both sides of the load are shorted to ground, the power into load 3 is highly reduced. In any short situation the use of output short-circuit-protected operational amplifiers will protect the current source itself.

In the embodiment shown in FIG. 1, inverter 10 is connected to the non-inverting input of second operational amplifier 2 so that a symmetrical differential input voltage is applied across the respective non-inverting inputs of the first and second operational amplifiers to control the current through load 3.

When there is a need to control the current source with a digital control signal, digital-to-analog converter 11 is used to provide an analog input voltage in response to a digital control signal.

When there is a need to control the current source with a symmetrical bipolar input voltage, inverter 1O is eliminated and the symmetrical bipolar input voltage is connected between the non-inverting inputs of the first and second operational amplifiers.

The benefits specifically stated herein do not necessarily apply to every conceivable embodiment of the present invention. Further, such stated benefits of the present invention are only examples and should not be construed as the only benefits of the present invention.

While the above description contains much specificity, these specificities are not to be construed as limitations on the scope of the present invention, but rather as examples of the preferred embodiments described herein. Other variations are possible and the scope of the present invention should be determined not by the embodiments described herein but rather by the claims and their legal equivalents. The claims require no implicit limitations. Each claim is to be construed explicitly as stated, or by its legal equivalent.

What is claimed is:

1. A voltage controlled current source for providing to a floating resistive load a current that is proportional to an input voltage, while maintaining the load at symmetrical potentials, the current source comprising:

first and second operational amplifiers for providing a current through the load that is proportional to an input voltage applied across the respective non-inverting inputs of the first and second operational amplifiers;

sensing means connected to the outputs of the first and second operational amplifiers for providing voltage drops that are proportional to the current through the load; and summing means connected to the sensing means for providing to the inverting inputs of the first and second operational amplifiers voltages that offset the sum of the voltage drops provided by the sensing means so that the current through the load is maintained in constant proportion to the input voltage.

2. The voltage controlled current source of claim 1 in combination with means for applying a differential and symmetrical input voltage across the respective non-inverting inputs of the first and second operational amplifiers.

3. The voltage controlled current source of claim 1 in combination with means for applying a unipolar input voltage across the respective non-inverting inputs of the first and second operational amplifiers.

4. The voltage controlled current source of claim 1 in combination with a digital-to-analog converter for applying an analog input voltage across the respective non-inverting inputs of the first and second operational amplifiers in response to a digital control signal.

5. A voltage controlled current source for providing to a floating resistive load a current that is proportional to an input voltage while maintaining the load at symmetrical potentials, the current source comprising:

first and second operational amplifiers for providing a current through the load that is proportional to an input voltage applied across the respective non-inverting inputs of the first and second operational amplifiers;

first and second resistors respectively connected to the outputs of the first and second operational amplifiers for providing voltage drops that are proportional to the current through the load when the first resistor is connected between the output of the first operational amplifier and one side of the load and the second resistor is connected between the output of the second operational amplifier and other side of the load;

a third resistor connected between the inverting input of the first operational amplifier and one side of the second resistor;

a fourth resistor connected between the inverting input of the second operational amplifier and one side of the first resistor;

a fifth resistor connected between the inverting input of the first operational amplifier and the output of the first operational amplifier, which is connected to the other side of the first resistor; and a sixth resistor connected between the inverting input of the second operational amplifier and the output of the second operational amplifier, which is connected to the other side of the second resistor;

wherein when the first and second resistors are connected to opposite sides of the load and power is being provided to the load, the third, fourth, fifth and sixth resistors in combination provide to the inverting inputs of the first and second operational amplifiers voltages that offset the sum of the voltage drops of the first and second resistors so that the current through the load is maintained in constant proportion to the input voltage.

6. The voltage controlled current source of claim 5 in combination with means for applying a differential and symmetrical input voltage across the respective non-inverting inputs of the first and second operational amplifiers.

7. The voltage controlled current source of claim 5 in combination with means for applying a unipolar input voltage across the respective non-inverting inputs of the first and second operational amplifiers.

8. The voltage controlled current source of claim 5 in combination with a digital-to-analog converter for applying an analog input voltage across the respective non-inverting inputs of the first and second operational amplifiers in response to a digital control signal.

9. A voltage controlled current source for providing to a floating resistive load a current that is proportional to an input voltage, while maintaining the load at symmetrical potentials, the current source comprising:

first and second operational amplifiers for providing a current through the load that is proportional to an input voltage applied across the respective non-inverting inputs of the first and second operational amplifiers;

sensing means connected to the outputs of the first and second operational amplifiers for providing voltage drops that are proportional to the current through the load;

summing means connected to the sensing means for providing to the inverting inputs of the first and second operational amplifiers voltages that offset the sum of the voltage drops provided by the sensing means so that the current through the load is maintained in constant proportion to the input voltage; and means for applying a differential and symmetrical input voltage across the respective non-inverting inputs of the first and second operational amplifiers.

10. A voltage controlled current source for providing to a floating resistive load a current that is proportional to an input voltage, while maintaining the load at symmetrical potentials, the current source comprising:

first and second operational amplifiers for providing a current through the load that is proportional to an input voltage applied across the respective non-inverting inputs of the first and second operational amplifiers;

sensing means connected to the outputs of the first and second operational amplifiers for providing voltage drops that are proportional to the current through the load;

summing means connected to the sensing means for providing to the inverting inputs of the first and second operational amplifiers voltages that offset the sum of the voltage drops provided by the sensing means so that the current through the load is maintained in constant proportion to the input voltage; and means for applying a unipolar input voltage across the respective non-inverting inputs of the first and second operational amplifiers.

* * * * *